United States Patent
Lin et al.

(10) Patent No.: US 9,345,164 B2
(45) Date of Patent: May 17, 2016

(54) ELECTRONIC DEVICE HAVING SECURITY STRUCTURE

(71) Applicant: Wistron Corporation, New Taipei (TW)

(72) Inventors: Shih-Lung Lin, New Taipei (TW); Ta-Wei Chen, New Taipei (TW); Yi-Shan Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 22 days.

(21) Appl. No.: 14/445,067

(22) Filed: Jul. 29, 2014

(65) Prior Publication Data

US 2015/0289400 A1 Oct. 8, 2015

(30) Foreign Application Priority Data

Apr. 8, 2014 (TW) .............................. 103112842 A (51) Int. Cl.
*H05K 5/00* (2006.01)
*H05K 7/14* (2006.01)

(52) U.S. Cl.
CPC .................................. *H05K 7/1487* (2013.01)

(58) Field of Classification Search
USPC .................. 361/728–732, 752, 755, 759, 796, 361/800–802
See application file for complete search history.

(56) References Cited

U.S. PATENT DOCUMENTS

| | | | | | |
|---|---|---|---|---|---|
| 5,593,219 | A | * | 1/1997 | Ho | G06F 1/181 220/4.02 |
| 5,982,619 | A | * | 11/1999 | Giannatto | H05K 7/1424 165/80.3 |
| 6,000,768 | A | * | 12/1999 | Dials | H05K 5/0221 312/223.2 |
| 7,304,855 | B1 | * | 12/2007 | Milligan | G11B 33/128 361/724 |
| 8,371,539 | B2 | * | 2/2013 | Hirota | G08C 17/02 248/27.1 |
| 9,152,189 | B2 | * | 10/2015 | Fan | G06F 1/187 |

FOREIGN PATENT DOCUMENTS

TW        M292247        6/2006

* cited by examiner

*Primary Examiner* — Hung S Bui
(74) *Attorney, Agent, or Firm* — Jianq Chyun IP Office (57) ABSTRACT

A electronic device includes a chassis, a panel, a cover and a security structure. The panel covers a side of the chassis. The cover covers another side of the chassis. The security structure includes a locking component, a positioning component and a linking shaft. The locking component is disposed on the panel and interfered with the chassis to lock the panel. The positioning component is disposed on the cover and interfered with the chassis to position the cover. The linking shaft is disposed between the locking component and the positioning component and stops the positioning component from being separated from the chassis. When a position of the locking component is adjusted to release the interference between the locking component and the chassis, the linking shaft is driven by the locking component to release the positioning component.

22 Claims, 11 Drawing Sheets

ELECTRONIC DEVICE HAVING SECURITY STRUCTURE

CROSS-REFERENCE TO RELATED APPLICATION

This application claims the priority benefit of Taiwan application serial no. 103112842, filed on Apr. 8, 2014. The entirety of the above-mentioned patent application is hereby incorporated by reference herein and made a part of this specification.

FIELD OF THE DISCLOSURE

The disclosure relates to an electronic device, and particularly to an electronic device with a security structure.

DESCRIPTION OF RELATED ART

A server is the core which serves all the computers in a network system and has the functions of providing network users discs, printing service, and so forth. Also, the server allows the users to share various kinds of resources in the network.

The basic structure of a server is substantially the same with a common personal computer, and is consisted of a central processing unit (CPU), a memory, an input/output device (I/O), and the like. In addition, an electric power module is commonly disposed in the chassis of the server for power supply, and a cover is used to cover the electric power module. The cover is commonly designed to be opened through an easy way such as pressing, pushing or pulling. As such, the users may accidentally touch the electric power module and get an electric shock, and the components within the chassis may apt to be stolen.

SUMMARY OF THE DISCLOSURE

The disclosure provides an electronic device, adapted to prevent users from accidentally touching the electric power module within the chassis, and the components within the chassis can be prevented from being stolen.

The electronic device of the disclosure includes a chassis, a panel, a cover and a security structure. The panel covers a side of the chassis. The cover covers another side of the chassis. The security structure includes a locking component, a positioning component and a linking shaft. The locking component is disposed on the panel and interfered with the chassis to lock the panel on the chassis, wherein a position of the locking component is adapted to be adjusted for further releasing an interference between the locking component and the chassis. The positioning component is disposed on the cover and interfered with the chassis to position the cover on the chassis. The linking shaft is disposed between the locking component and the positioning component, and stops the positioning component from being separated from the chassis. When the position of the locking component is adjusted to release the interference between the locking component and the chassis, the linking shaft is driven by the locking component to release the positioning component.

The security structure of the disclosure is used in an electronic device, and the electronic device includes a chassis, a panel and a cover. The panel covers a side of the chassis, and the cover covers another side of the chassis. The security structure includes a locking component, a positioning component and a linking shaft. The locking component is disposed on the panel and interfered with the chassis to lock the panel on the chassis, wherein a position of the locking component is adapted to be adjusted for further releasing an interference between the locking component and the chassis. The positioning component is disposed on the cover and interfered with the chassis to position the cover on the chassis. The linking shaft is disposed between the locking component and the positioning component, and stops the positioning component from being separated from the chassis. When the position of the locking component is adjusted to release the interference between the locking component and the chassis, the linking shaft is driven by the locking component to release the positioning component.

According to one exemplary embodiment of the disclosure, the locking component is pivoted to the panel.

According to one exemplary embodiment of the disclosure, the positioning component is slidingly disposed on the cover.

According to one exemplary embodiment of the disclosure, the electronic device further includes a circuit board, wherein the circuit board is disposed in the chassis and has an electric power module, and the cover covers the electric power module.

According to one exemplary embodiment of the disclosure, the security structure includes a lock head, wherein the locking component is connected to the lock head, and the lock head is adapted to drive the locking component to adjust the position to release the interference between the locking component and the chassis.

According to one exemplary embodiment of the disclosure, the locking component has a latching recess and is adapted to be latched to the chassis through the latching recess.

According to one exemplary embodiment of the disclosure, the chassis has an opening slot, and the locking component is disposed through the opening slot and adapted to be latched to an inner periphery of the opening slot.

According to one exemplary embodiment of the disclosure, the locking component has a first protruding portion, the linking shaft has a second protruding portion, when the locking component is interfered with the chassis, the first protruding portion pushes against the second protruding portion so as to stop the linking shaft from releasing the positioning component, and when the position of the locking component is adjusted to release the interference between the locking component and the chassis, the first protruding portion and the second protruding portion are staggered so that the linking shaft is adapted to release the positioning component.

According to one exemplary embodiment of the disclosure, the linking shaft is slidingly disposed on the cover and adapted to be driven by the locking component to slide.

According to one exemplary embodiment of the disclosure, the security structure comprises a first elastic element, the first elastic element is connected between the linking shaft and the cover, when the locking component is interfered with the chassis, the locking component resists an elastic force of the first elastic element and pushes against the linking shaft so as to stop the linking shaft from releasing the positioning component, and when the position of the locking component is adjusted to release the interference between the locking component and the chassis, the locking component does not push against the linking shaft and the linking shaft slides via the elastic force of the first elastic element and releases the positioning component.

According to one exemplary embodiment of the disclosure, the electronic device further includes a connecting element, wherein the connecting element is fixed on the cover, and the cover is connected to the first elastic element through the connecting element.

According to one exemplary embodiment of the disclosure, the connecting element has two protruding ribs, and the linking shaft is slidingly disposed between the two protruding ribs.

According to one exemplary embodiment of the disclosure, the positioning component is slidingly disposed on the cover along a first direction, the linking shaft is slidingly disposed on the cover along a second direction, and the first direction is perpendicular to the second direction.

According to one exemplary embodiment of the disclosure, the positioning component has at least one protruding post, the linking shaft has at least one space-allowing hole, the linking shaft is adapted to block the protruding post so as to stop the positioning component from being separated from the chassis, and the at least one space-allowing hole is adapted to be aligned with the protruding post with the linking shaft actuating so as to release the positioning component.

According to one exemplary embodiment of the disclosure, a diameter of the space-allowing hole is larger than an outer diameter of the protruding post.

According to one exemplary embodiment of the disclosure, the diameter of the space-allowing hole is equal to a, the outer diameter of the protruding post is equal to b, when the locking component is interfered with the chassis, a distance between a central axis of the protruding post and a central axis of the space-allowing hole is equal to L, when the locking component drives the linking shaft, an actuated stroke of the linking shaft is equal to S, wherein $L-(a-b)/2 \leq S \leq L+(a-b)/2$.

According to one exemplary embodiment of the disclosure, a hydraulic diameter of the space-allowing hole is larger than an outer diameter of the protruding post.

According to one exemplary embodiment of the disclosure, the security structure comprises at least one second elastic element, the second elastic element is disposed between the linking shaft and the positioning component, the positioning component is adapted to be interfered with the chassis through an elastic force of the second elastic element, and when the linking shaft releases the positioning component, the positioning component is adapted to resist the elastic force of the second elastic component to be separated from the chassis.

According to one exemplary embodiment of the disclosure, the positioning component has at least one positioning protruding block, the chassis has at least one positioning hole, and the positioning protruding block is adapted to insert into the positioning hole so that the cover is positioned on the chassis.

According to one exemplary embodiment of the disclosure, the security structure includes a handle, the cover has an opening, and the handle is connected to the positioning component and extends to an outer surface of the cover through the opening.

According to one exemplary embodiment of the disclosure, the electronic device further includes a holder, wherein the holder is fixed on the chassis and has a sliding slot, and the positioning component has a pillar and is slidingly disposed on the sliding slot through the pillar.

In light of the above, in the security structure of the electronic device of the disclosure, not only a locking component for locking the panel and a positioning component for positioning the cover are disposed, but also a linking shaft is disposed between the locking component and the positioning component. The linking shaft is used to stop the positioning component from being separated from the chassis, so that the cover is not apt to be opened. The position of the locking component is needed to be adjusted to drive the linking shaft, such that the positioning component is released by the linking shaft. Accordingly, the electronic device can prevent users from accidentally touching the electric power module within the chassis due to the cover being so apt to be opened, and the components within the chassis can be prevented from being stolen.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
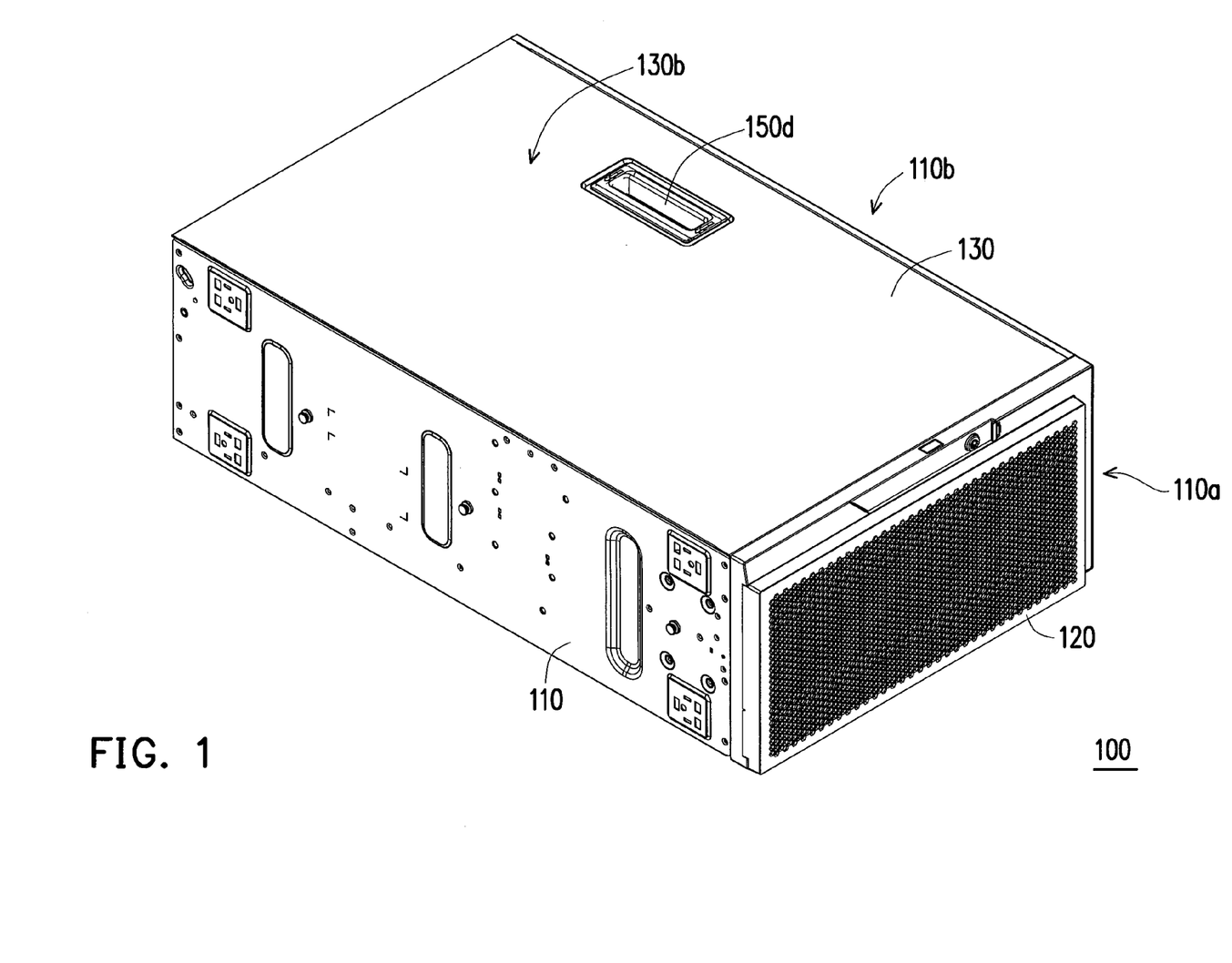
FIG. 1 is a perspective view of an electronic device of the first embodiment of the disclosure.
Figure 2:
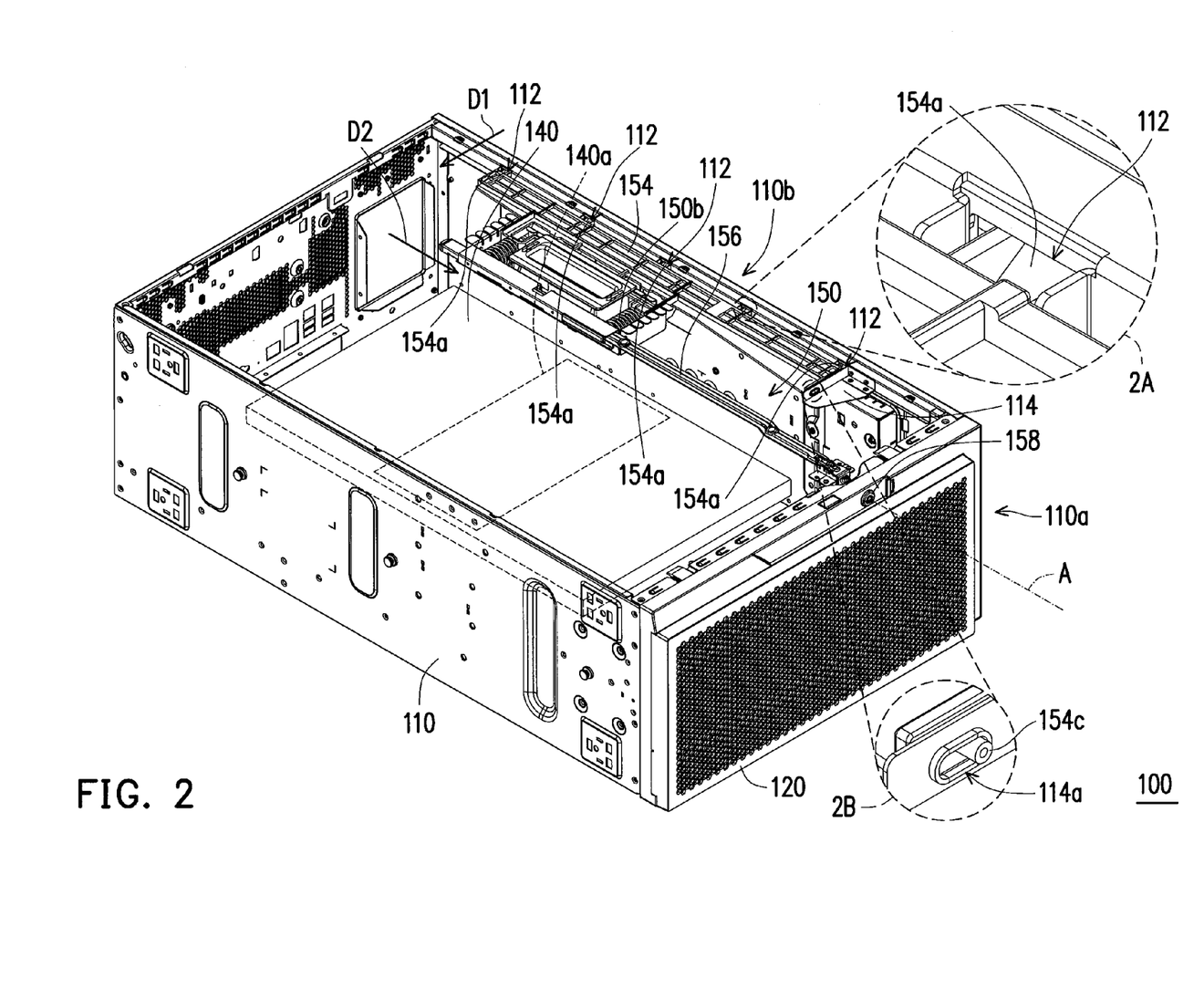
FIG. 2 is a structural perspective view of the electronic device in FIG. 1.

FIG. 1 is a perspective view of an electronic device of the first embodiment of the disclosure. FIG. 2 is a structural perspective view of the electronic device in FIG. 1. Referring to FIG. 1 and FIG. 2, the electronic device 100 of the embodiment is a server, for example, and includes a chassis 110, a panel 120, a cover 130, a circuit board 140 and a security structure 150. The panel 120 covers a side (shown at the front end 110a of the chassis) of the chassis 110, the circuit board 140 is disposed within the chassis 110 and has an electric power module 140a, and the cover 130 covers another side (shown at the side end 110b of the chassis) of the chassis 110 and shields the electric power module 140a. The type of the electric power module 140a is not limited in the disclosure, the location of the electric power module 140a is shown with a dash-line frame is FIG. 2, the voltage thereof is 240 volt, for example, and the electric power module 140a is a high voltage electric power module. The security structure 150 is used for locking the panel 120 on the chassis 110 and the cover 130 is positioned on the chassis 110, and the detailed description is as follows.

Figure 3:
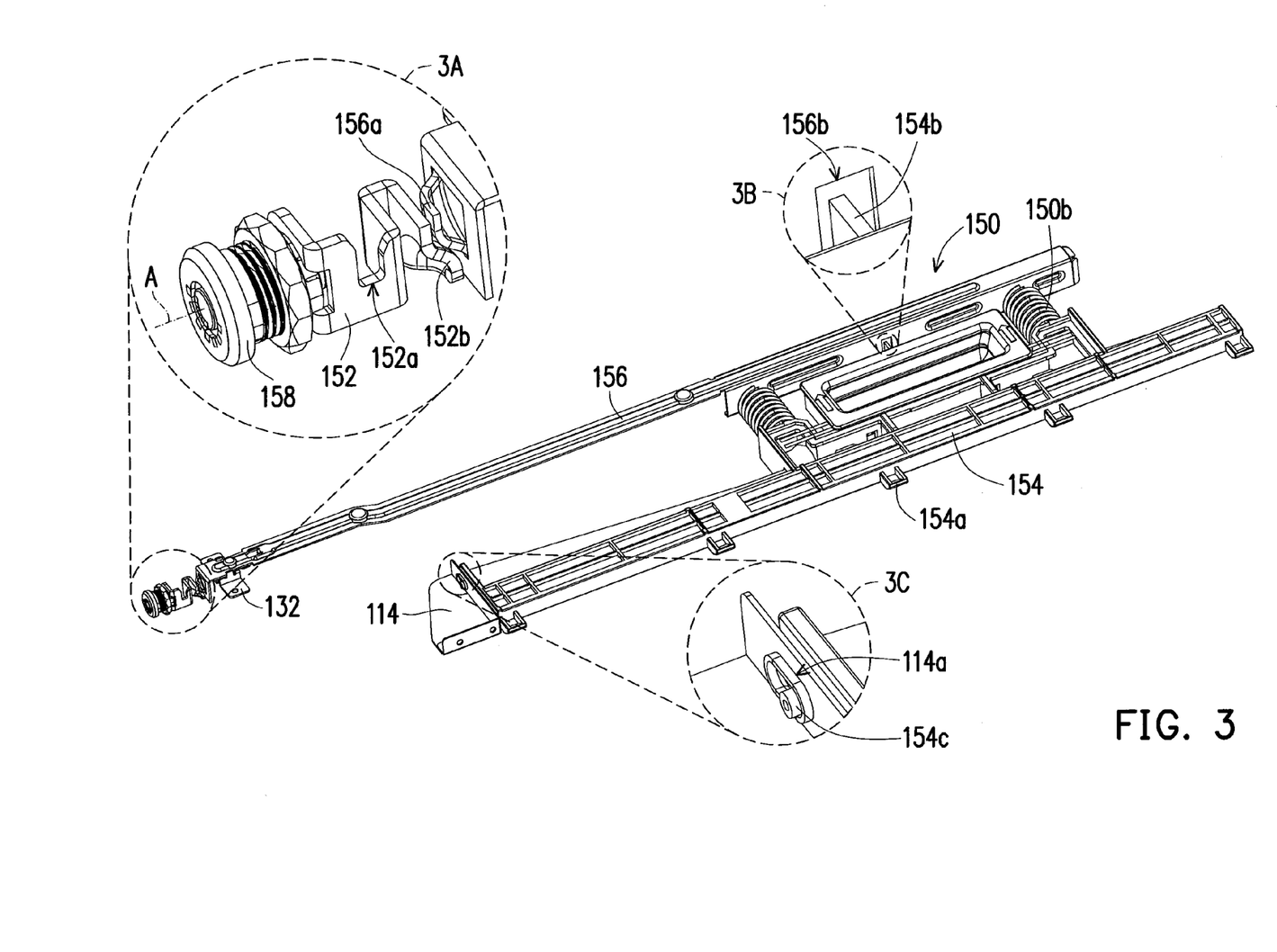
FIG. 3 is a partial structural perspective view of the security structure in FIG. 2.
Figure 4:
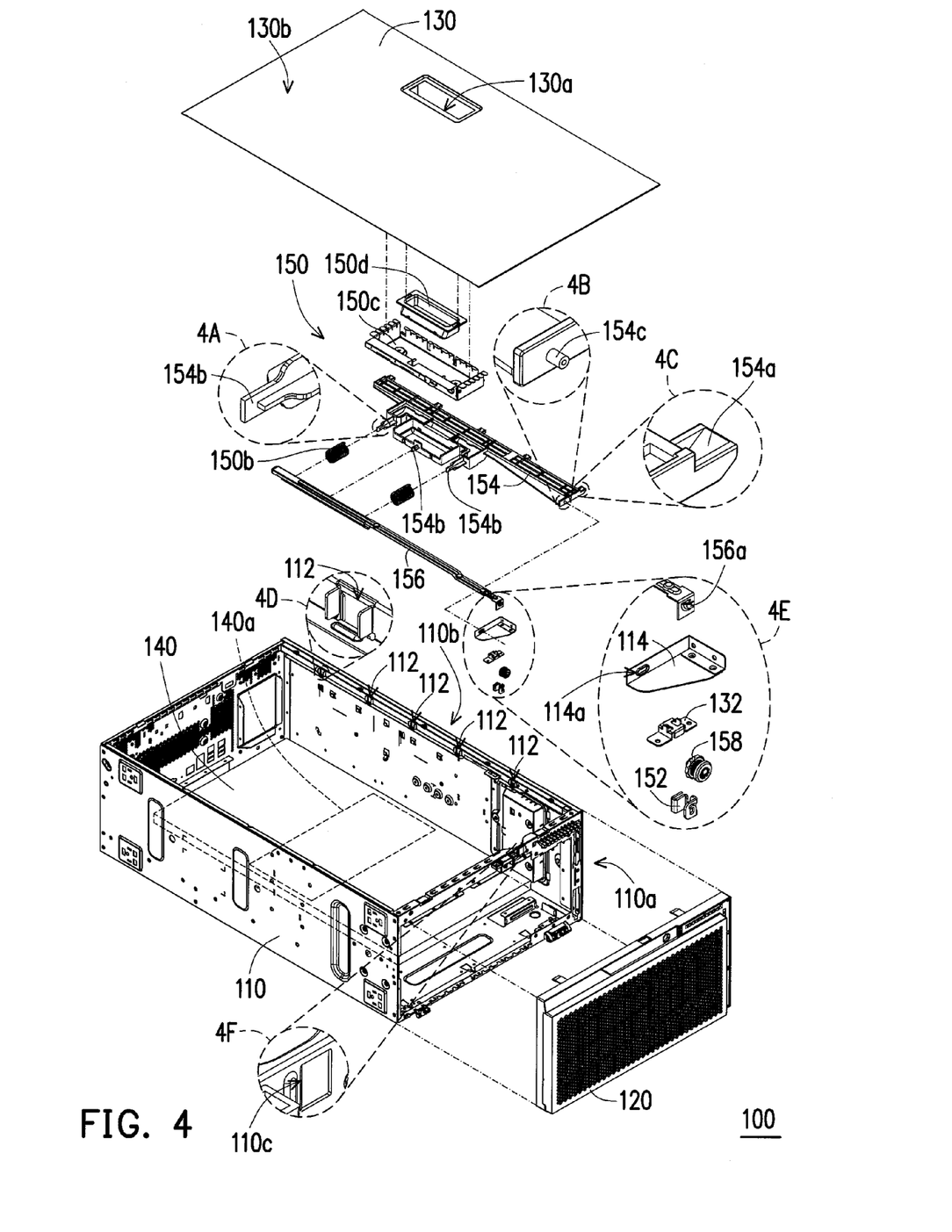
FIG. 4 is a structural perspective view of the electronic device in FIG. 1.
Figure 5:
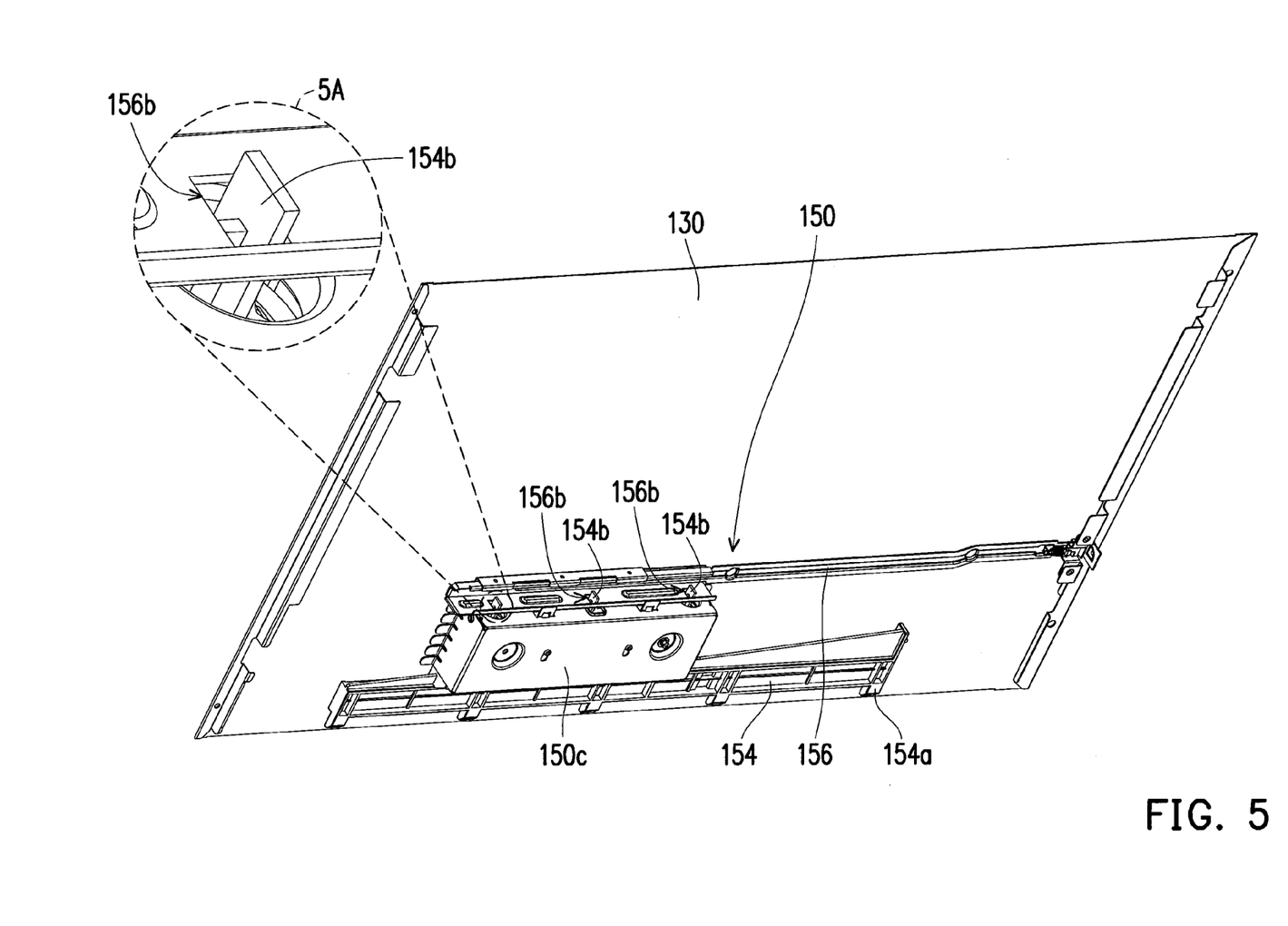
FIG. 5 is a perspective view of the security structure and the cover in FIG. 4.

FIG. 3 is a partial structural perspective view of the security structure in FIG. 2. FIG. 4 is a structural perspective view of the electronic device in FIG. 1. FIG. 5 is a perspective view of the security structure and the cover in FIG. 4. Referring to FIG. 2 through FIG. 5, the security structure 150 includes a locking component 152, a positioning component 154, a linking shaft 156 and a lock head 158 (referring to FIG. 3 and its enlarged potion 3A, and FIG. 4 and its enlarged portion 4E). The locking component 152 is connected to the lock head 158 and is pivoted to the panel 120 along the axis A and interfered with the chassis 110 to lock the panel 120 on the chassis 110, wherein the lock head 158 may drive the locking component 152 to rotate and adjusted the position for further releasing the interference between the locking component 152 and the chassis 110. The chassis 110 has a plurality of positioning holes 112 (referring to FIG. 2 and its enlarged portion 2A, and FIG. 4 and its enlarged portion 4D), the positioning component 154 has a plurality of positioning protruding blocks 154a (referring to FIG. 2 and its enlarged portion 2A, and FIG. 4 and its enlarged portion 4C) and is slidingly disposed on the cover 130 shown in FIG. 1, FIG. 4 and FIG. 5 along the first direction D1 (indicated in FIG. 2) which is parallel to the axis A. Each of the positioning protruding blocks 154a inserts into the correspondingly positioning hole 112 as shown in FIG. 2, so that the positioning component 154 is interfered with the chassis 110, and the cover 130 is positioned on the chassis 110. The linking shaft 156 is slidingly disposed on the cover 130 shown in FIG. 1, FIG. 4 and FIG. 5 along the second direction D2 (indicated in FIG. 2) which is perpendicular to the first direction D1, and disposed between the locking component 152 and the positioning component 154, wherein the linking shaft 156 is used to stop the positioning component 154 from being separated from the chassis 110 and may be driven by the locking component 152 to slide along the second direction D2.

Figure 6:
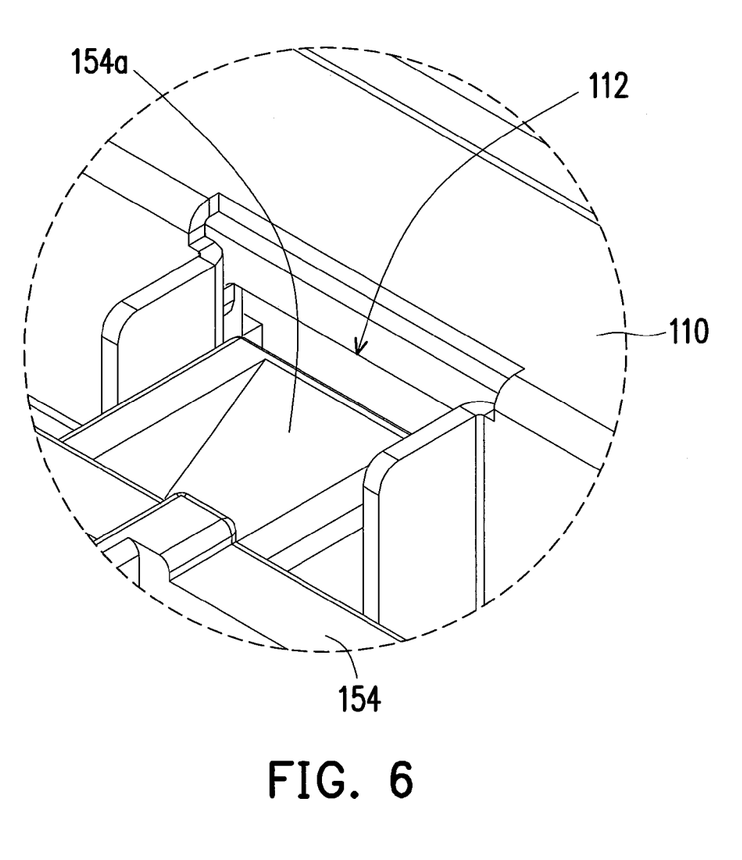
FIG. 6 is a locally enlarged view illustrating the positioning component being separated from the chassis of FIG. 2.

FIG. 6 is a locally enlarged view illustrating the positioning component of FIG. 2 being separated from the chassis. If the user wants to open the panel 120 and the cover 130, a key may be used to rotate the lock head 158 for driving the locking component 152 to rotate along the axis A to release the interference between the locking component 152 and the chassis 110, so that the panel 120 may be opened. If the locking component 152 is rotated to release the interference between the locking component 152 and the chassis 110 as mentioned above, the linking shaft 156 may be driven by the locking component 152 to slide along the second direction D2 and release the positioning component 154, so that the positioning component 154 may slide along the first direction D1 due to the user's applying force, and in the moment the positioning protruding blocks 154a of the positioning component 154 may be separated from the positioning holes 112 of the chassis 110 as shown in FIG. 6, so that the cover 130 may be opened.

In such configuration of the security structure 150, in addition to disposing of the locking component 152 for locking the panel 120 and the positioning component 152 for positioning the cover 130, the linking shaft 156 is further disposed between the locking component 152 and the positioning component 154. The linking shaft 156 is used to stop the positioning component 154 from being separated from the chassis 110, in order that the cover 130 is not apt to be opened. The user needs to rotate the locking component 152 to drive the linking shaft 156, such that the positioning component 154 may be released by the linking shaft 156. Accordingly, the user can avoid accidentally touching the high voltage electric power module 140a within the chassis 110 due to the cover 130 being so apt to be opened, and the components within the chassis 110 can be prevented from being stolen. In addition, in the design mentioned above, the panel 120 and the cover 130 are fixed or released at the same time through operating a single lock head 158, thus it is no need to disposed two sets of lock heads to individually correspond to the panel 120 and the cover 130. As such, the manufacturing cost of the security structure 150 may be reduced and the convenience of releasing the panel 120 and the cover 130 may be improved.

As shown in FIG. 2 through FIG. 4, the electronic device 100 of the embodiment further includes a holder 114. The holder 114 is fixed on the chassis 110 and has a sliding slot 114a (referring to FIG. 2 and its enlarged portion 2B, FIG. 3 and its enlarged portion 3C, and FIG. 4 and its enlarged portion 4E), and the positioning component 154 has a pillar 154c (referring to FIG. 2 and its enlarged portion 2B, FIG. 3 and its enlarged portion 3C, and FIG. 4 and its enlarged portion 4B) and is slidingly disposed on the sliding slot 114a of the holder 114 through the pillar 154c along the first direction D1. In other embodiments, the positioning component 154 may be slidingly disposed by using other types of structure, which should not be construed as a limitation to the disclosure.

Figure 7:
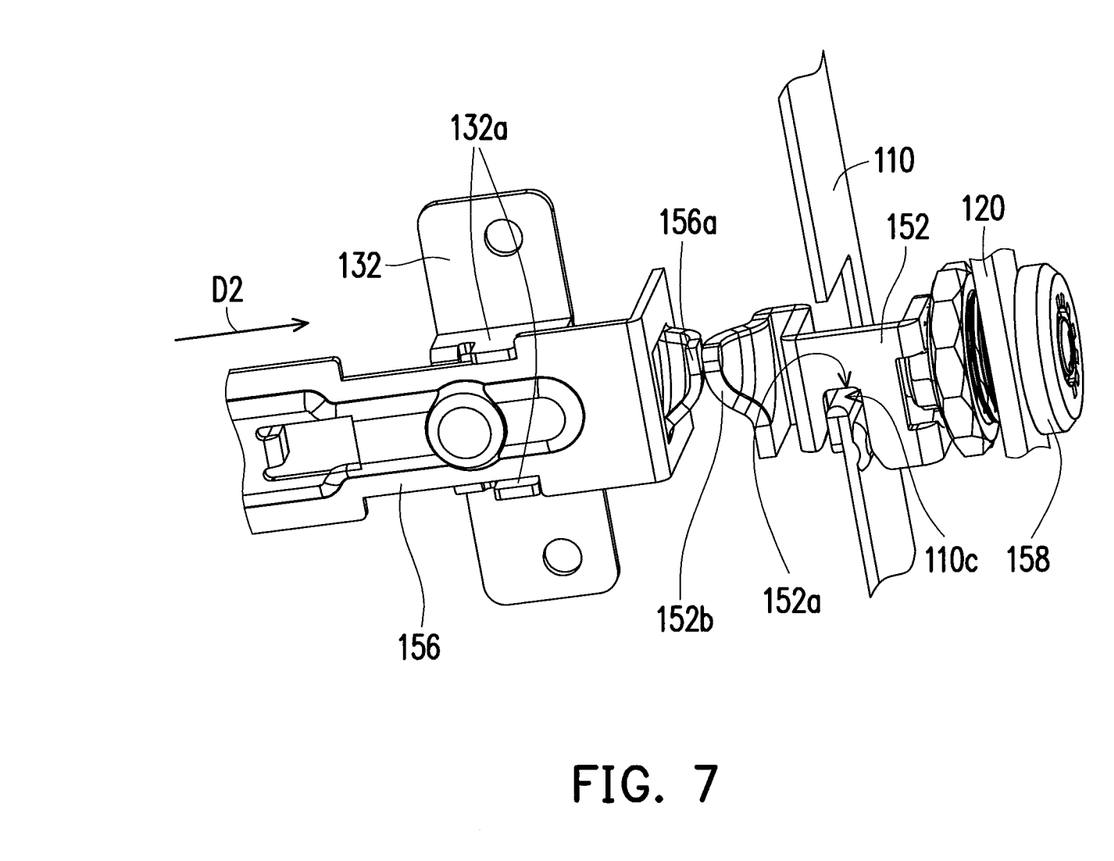
FIG. 7 is a partial perspective view of an electronic device of the second embodiment of the disclosure.
Figure 8:
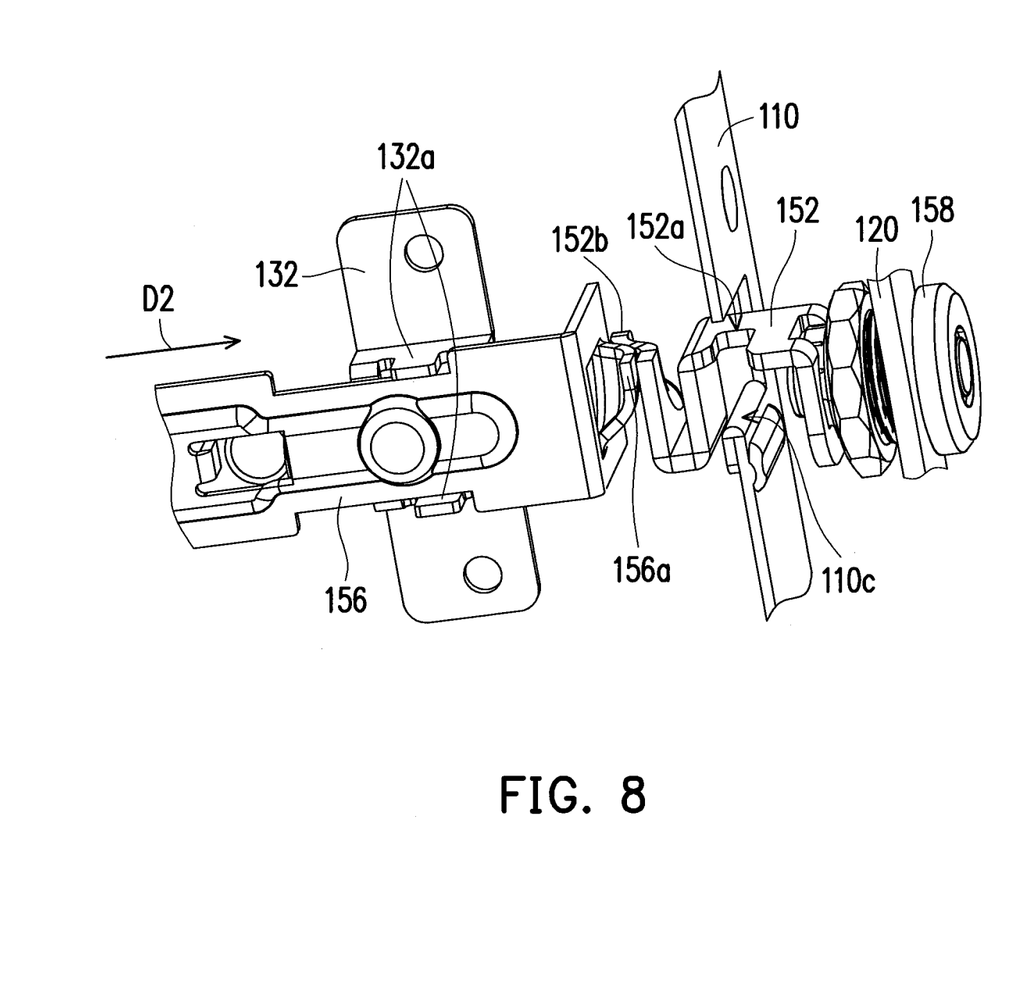
FIG. 8 is a view illustrating the interference between the locking component and the chassis of FIG. 7 being released.
Figure 9:
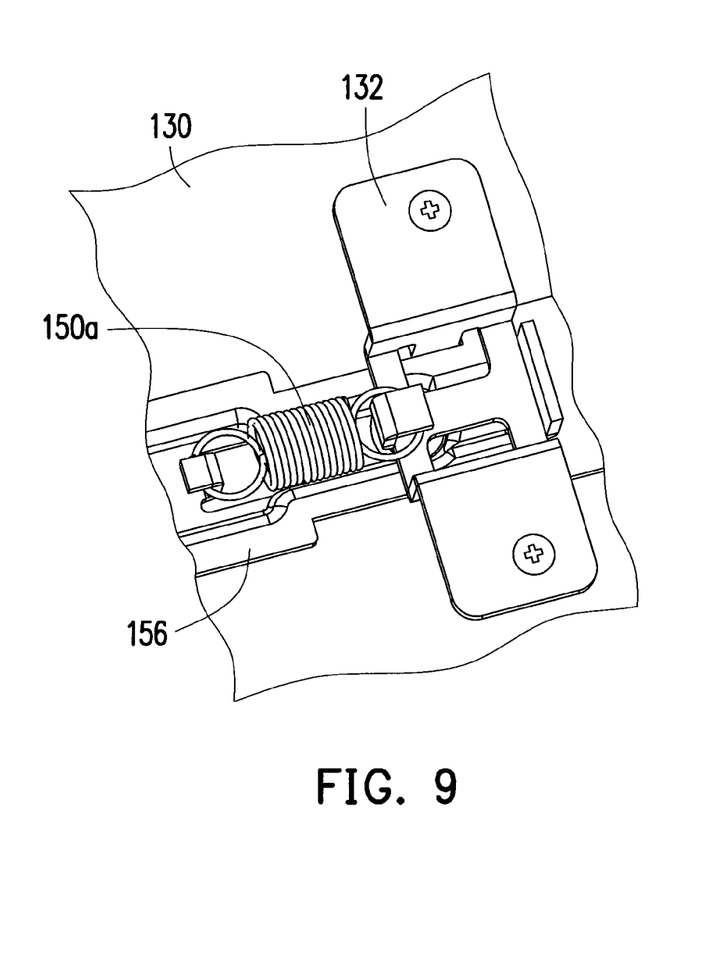
FIG. 9 is a view illustrating the first elastic element is connected between the linking shaft and the cover of FIG. 7.

The methods of interference between the locking component 152 and the chassis 110 and the locking component 152 driving the linking shaft 156 of the embodiment are specifically described with drawings as follows. FIG. 7 is a partial perspective view of an electronic device of the second embodiment of the disclosure. FIG. 8 is a view illustrating the interference between the locking component and the chassis of FIG. 7 being released. FIG. 9 is a view illustrating the first elastic element is connected between the linking shaft and the cover of FIG. 7. Referring to FIG. 7 through FIG. 9, the locking component 152 of the embodiment has a latching recess 152a (also shown in FIG. 3 and its enlarged portion 3A) and a first protruding portion 152b (also shown in FIG. 3 and its enlarged portion 3A), the chassis 110 has a opening slot 110c (also shown in FIG. 4 and its enlarged portion 4F), the linking shaft 156 has a second protruding portion 156a (also shown in FIG. 3 and its enlarged portion 3A), and the security structure 150 further includes a first elastic element 150a. The first elastic element 150a may be, for example, a tension spring and connected between the linking shaft 156 and the cover 130, wherein the cover 130 is connected to the first elastic element 150a through the connecting element 132 which is fixed on the cover 130, for example. The locking component 152 may be latched on the inner periphery of the opening slot 110c of the chassis 110 through the latching recess 152a as shown in FIG. 7, so that the panel 120 is fixed on the chassis 110 through the interference between the locking component 152 and the chassis 110. When the locking component 152 is interfered with the inner periphery of the opening slot 110c of the chassis 110 via the latching recess 152a as shown in FIG. 7, the first protruding portion 152b of the locking component 152 resists the elastic force of the first elastic element 150a and pushes against the second protruding portion 156a of the linking shaft 156, so as to stop the linking shaft 156 from sliding along the second direction D2 and releasing the positioning component 154. When the locking component 152 is rotated and the interference between the latching recess 152a of the locking component 152 and the inner periphery of the opening slot 110c of the chassis 110 is released as shown in FIG. 8, the first protruding portion 152b and the second protruding portion 156a are staggered and the locking component 152 does not push against the linking shaft 156, at this moment the linking shaft 156 slides along the second direction D2 due to the elastic force of the first elastic element 150a to release the positioning component 154.

As shown in FIG. 7 and FIG. 8, the linking shaft 132 of the embodiment has two protruding ribs 132a, and the linking shaft 156 is slidingly disposed between the two protruding ribs 132a along the second direction D2, in order to slide. In other embodiments, the linking shaft 156 may be slidingly disposed by using other types of structure, which should not be construed as a limitation to the disclosure.

Figure 10:
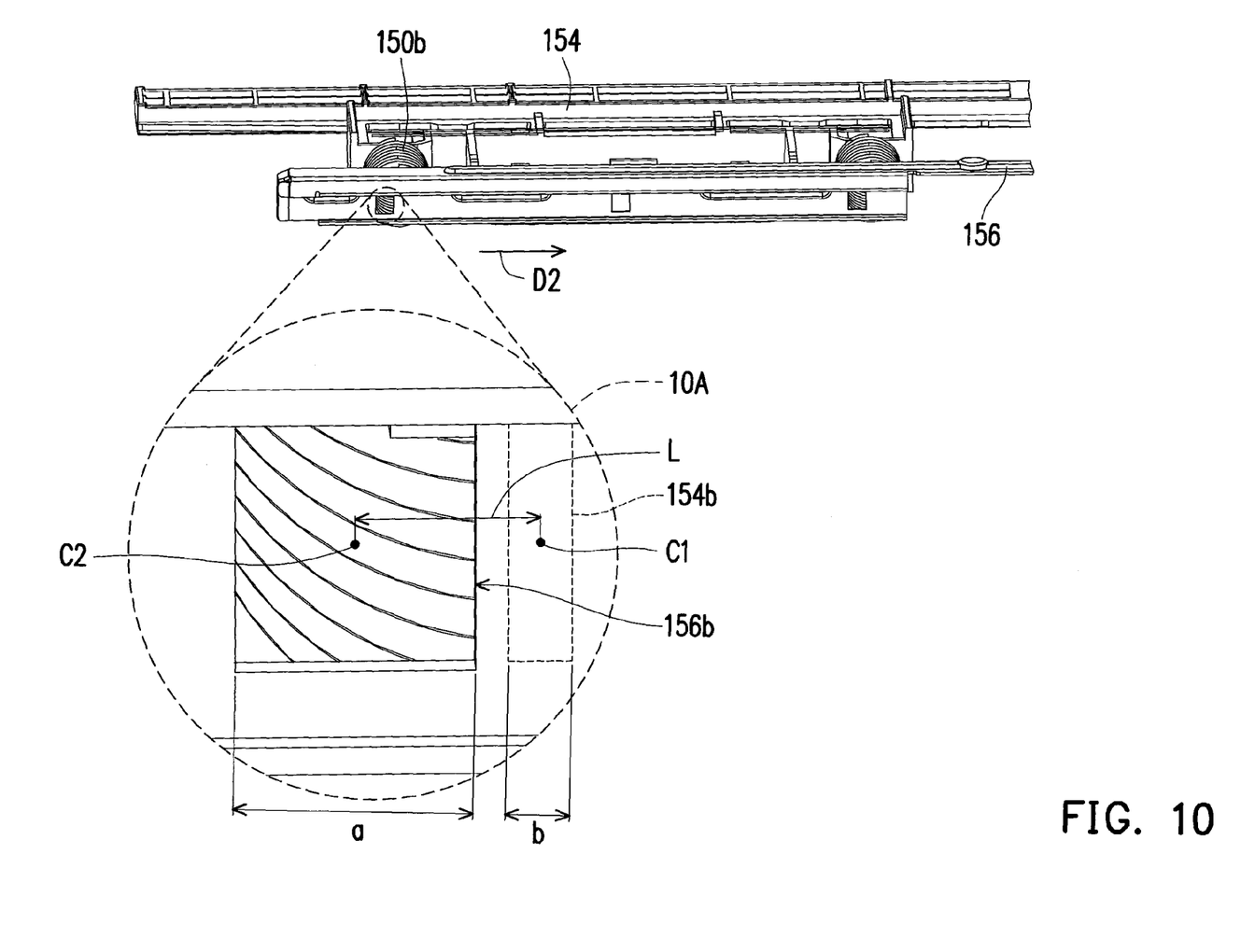
FIG. 10 is a partial perspective view of an electronic device of the third embodiment of the disclosure.
Figure 11:
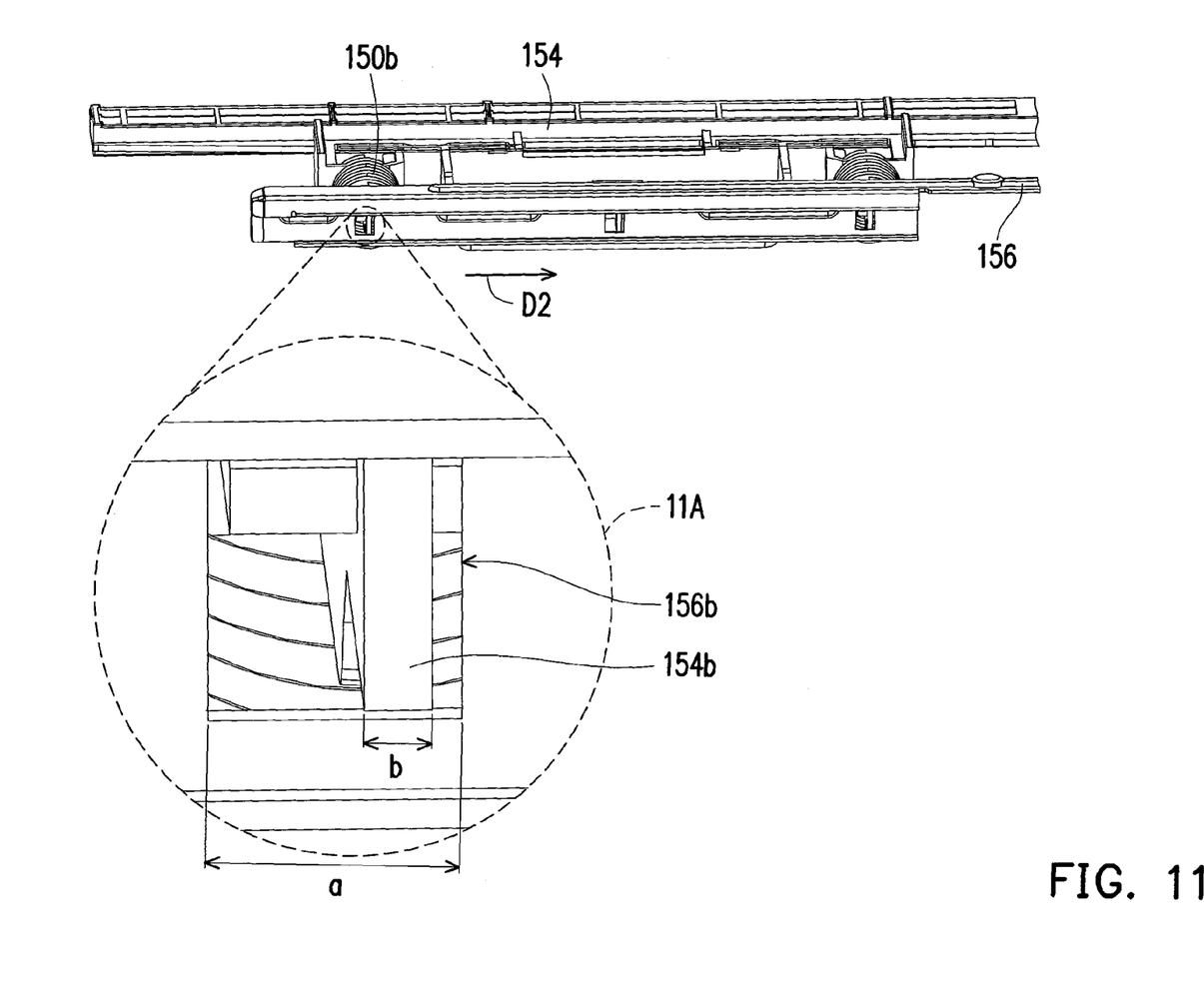
FIG. 11 shows the space-allowing hole of FIG. 10 being aligned with the protruding post.

The method of the linking shaft 156 releasing the positioning component 154 of the embodiment is specifically described with drawings as follows. FIG. 10 is a partial perspective view of an electronic device of the third embodiment of the disclosure. FIG. 11 shows the space-allowing hole of FIG. 10 being aligned with the protruding post. Referring to FIG. 3 through FIG. 5, FIG. 10 and FIG. 11, the positioning component 154 further has a plurality of protruding posts 154b (referring to FIG. 3 and its enlarged portion 3B, FIG. 4 and its enlarged portion 4A, and FIG. 5 and its enlarged portion 5A), and the linking shaft 156 has at least one space-allowing hole 156b (referring to FIG. 3 and its enlarged portion 3B, and FIG. 5 and its enlarged portion 5A). When the security structure 150 is in the condition of FIG. 2 and FIG. 7 such that the space-allowing holes 156b of the linking shaft 156 and the protruding posts 154b of the positioning component 154 are staggered as shown in FIG. 10 and its enlarged portion 10A, the linking shaft 156 may stop the protruding posts 154b to stop the positioning component 154 sliding along the first direction D1 (indicated in FIG. 2) and being separated from the chassis 110. When the security structure 150 is actuated to be in the condition shown in FIG. 8, along with the actuation of the linking shaft 156, each of the space-allowing holes 156b may be aligned with the corresponding protruding post 154b as shown in FIG. 11 and its enlarged portion 11A to release the positioning component 154, and the user may apply force to the positioning component 154 along the first direction D1, such that each of the protruding posts 154b of the positioning component 154 inserts into the corresponding space-allowing hole 156b, and the positioning protruding blocks 154a of the positioning component 154 may be separated from the positioning holes 112 of the chassis 110 as shown in FIG. 6.

In the embodiment, the diameter a of each space-allowing hole 156b is larger than the outer diameter b of each protruding post 154b, so that, under a condition that the actuated stroke of the linking shaft 154 is in an error range, a space allowing effect may still be achieved through the cooperating of each space-allowing hole 156b and each protruding post 154b. Specifically, when the locking component 152 is interfered with the chassis 110 as shown in FIG. 7 and makes the linking shaft 156 to be in the position shown in FIG. 10, the distance between the central axis C1 of each protruding post 154b and the central axis C2 of the corresponding space-allowing hole 156b is equal to L, when the locking component 152 is rotated as shown in the status of FIG. 8 so as to drive the linking shaft 156 to slide along the second direction D2 as mentioned above to be in the position which is shown in FIG. 11, the actuated stroke of the linking shaft 156 is equal to S, wherein $L-(a-b)/2 \leq S \leq L+(a-b)/2$, which is the error range of the actuated stroke of the linking shaft 156. In the error range of the actuated stroke, each protruding post 154b may not stopped by the linking shaft 156 and may successfully insert into the corresponding space-allowing hole 156b.

It has to be mentioned that, the space-allowing holes 156b of the embodiment may be rectangular openings and the diameter a may be the width along the second direction D2, the cross section of the protruding post 154b may be a rectangular and the outer diameter b may be the width along the second direction D2. In other embodiments, the cross section of each space-allowing hole 156b may be any other suitable shapes and the effective diameter is larger than the outer diameter of protruding post 154b, such that the protruding post 154b may successfully insert into the space-allowing hole 156b, wherein the effective diameter may be the hydraulic diameter $D_H$ of the space-allowing hole, for example, however the disclosure is not limited thereto.

The security structure 150 of the embodiment includes at least one second elastic element 150b (two are shown in the figure), each of the second elastic elements 150b may be a compression spring, for example, and disposed between the linking shaft 156 and the positioning component 154. The positioning component 154 may be interfered with the positioning holes 112 of the chassis 110 via the positioning protruding blocks 154a through the elastic force of each of the second elastic elements 150b as shown in FIG. 2. When the linking shaft 156 releases the positioning component 154 as shown in FIG. 11, the user may apply force to the positioning component 154, so that the positioning component 154 resists the elastic force of the second elastic element 150b and slides along the first direction D1, in order to drive each of the positioning blocks 154a to be separated from each of the positioning holes 112 of the chassis 110 as shown in FIG. 6.

With reference to FIG. 4, in the embodiment, the security structure 150 further includes a carrier 150c and a handle 150d, and the cover 130 has an opening 130a. The carrier 150c is fixed on the cover 130, and the positioning component 154 and the linking shaft 156 are slidingly disposed on the cover 130 through the carrier 150c. The handle 150d is connected to the positioning component 154 and extends to the outer surface 130b of the cover 130 through the opening 130a, in order that the user may apt to apply force to the handle 150d and drive the positioning component 154 to slide.

In light of the foregoing, in the security structure of the electronic device of the disclosure, besides a locking component for locking the panel and a positioning component for positioning the cover are disposed, a linking shaft is also disposed between the locking component and the positioning component. The linking shaft is used to stop the positioning component from being separated from the chassis, so that the cover is not apt to be opened. The user is required to use a key to rotate the lock head for rotating the locking component and driving the linking shaft, such that the positioning component is released by the linking shaft. Accordingly, the electronic device can prevent users from accidentally touching the electric power module within the chassis since the cover is so apt to be opened, and the components within the chassis can be prevented from being stolen. In addition, in the design mentioned above, the panel and the cover are fixed or released at the same time through operating a single lock head, thus it is no need to disposed two sets of lock heads to individually correspond to the panel and the cover. As such, the manufacturing cost of the security structure may be reduced and the convenience of releasing the panel and the cover may be improved.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An electronic device, comprising:
   a chassis;
   a panel, covering a side of the chassis;
   a cover, covering another side of the chassis; and a security structure, comprising:
  a locking component, disposed on the panel and interfered with the chassis to lock the panel on the chassis, wherein a position of the locking component is adapted to be adjusted for further releasing an interference between the locking component and the chassis;
  a positioning component, disposed on the cover and interfered with the chassis to position the cover on the chassis; and
  a linking shaft, disposed between the locking component and the positioning component and stopping the positioning component from being separated from the chassis, wherein when the position of the locking component is adjusted to release the interference between the locking component and the chassis, the linking shaft is driven by the locking component to release the positioning component.

2. The electronic device as claimed in claim 1, wherein the locking component is pivoted to the panel, wherein the positioning component is slidingly disposed on the cover, wherein the circuit board is disposed in the chassis and has an electric power module, and the cover covers the electric power module.

3. The electronic device as claimed in claim 1, wherein the security structure comprises a lock head, the locking component is connected to the lock head, and the lock head is adapted to drive the locking component to adjust the position to release the interference between the locking component and the chassis, wherein the locking component has a latching recess and is adapted to be latched to the chassis through the latching recess, the chassis has an opening slot, and the locking component is disposed through the opening slot and adapted to be latched to an inner periphery of the opening slot.

4. The electronic device as claimed in claim 1, wherein the locking component has a first protruding portion, the linking shaft has a second protruding portion, when the locking component is interfered with the chassis, the first protruding portion pushes against the second protruding portion so as to stop the linking shaft from releasing the positioning component, and when the position of the locking component is adjusted to release the interference between the locking component and the chassis, the first protruding portion and the second protruding portion are staggered so that the linking shaft is adapted to release the positioning component.

5. The electronic device as claimed in claim 1, wherein the linking shaft is slidingly disposed on the cover and adapted to be driven by the locking component to slide.

6. The electronic device as claimed in claim 5, wherein the security structure comprises a first elastic element, the first elastic element is connected between the linking shaft and the cover, when the locking component is interfered with the chassis, the locking component resists an elastic force of the first elastic element and pushes against the linking shaft so as to stop the linking shaft from releasing the positioning component, and when the position of the locking component is adjusted to release the interference between the locking component and the chassis, the locking component does not push against the linking shaft and the linking shaft slides via the elastic force of the first elastic element and releases the positioning component.

7. The electronic device as claimed in claim 6, further comprising a connecting element, wherein the connecting element is fixed on the cover, and the cover is connected to the first elastic element through the connecting element, wherein the connecting element has two protruding ribs, and the linking shaft is slidingly disposed between the two protruding ribs, wherein the positioning component is slidingly disposed on the cover along a first direction, the linking shaft is slidingly disposed on the cover along a second direction, and the first direction is perpendicular to the second direction.

8. The electronic device as claimed in claim 1, wherein the positioning component has at least one protruding post, the linking shaft has at least one space-allowing hole, the linking shaft is adapted to block the protruding post so as to stop the positioning component from being separated from the chassis, and the space-allowing hole is adapted to be aligned with the protruding post with the linking shaft actuating so as to release the positioning component.

9. The electronic device as claimed in claim 8, wherein a diameter of the space-allowing hole is larger than an outer diameter of the protruding post, wherein the diameter of the space-allowing hole is equal to a, the outer diameter of the protruding post is equal to b, when the locking component is interfered with the chassis, a distance between a central axis of the protruding post and a central axis of the space-allowing hole is equal to L, when the locking component drives the linking shaft, an actuated stroke of the linking shaft is equal to S, wherein $L-(a-b)/2 \leq S \leq L+(a-b)/2$, wherein a hydraulic diameter of the space-allowing hole is larger than an outer diameter of the protruding post.

10. The electronic device as claimed in claim 1, wherein the security structure comprises at least one second elastic element, the second elastic element is disposed between the linking shaft and the positioning component, the positioning component is adapted to be interfered with the chassis through an elastic force of the second elastic element, and when the linking shaft releases the positioning component, the positioning component is adapted to resist the elastic force of the second elastic component to be separated from the chassis.

11. The electronic device as claimed in claim 1, wherein the positioning component has at least one positioning protruding block, the chassis has at least one positioning hole, and the positioning protruding block is adapted to insert into the positioning hole so that the cover is positioned on the chassis, wherein the security structure comprises a handle, the cover has an opening, and the handle is connected to the positioning component and extends to an outer surface of the cover through the opening wherein the electronic device further comprising a holder, the holder is fixed on the chassis and has a sliding slot, and the positioning component has a pillar and is slidingly disposed on the sliding slot through the pillar.

12. A security structure, adapted to an electronic device, the electronic device comprising a chassis, a panel and a cover, the panel covering a side of the chassis, the cover covering another side of the chassis, the security structure comprising:
  a locking component, disposed on the panel and interfered with the chassis to lock the panel on the chassis, wherein a position of the locking component is adapted to be adjusted for further releasing an interference between the locking component and the chassis, wherein the locking component is pivoted to the panel, the chassis has an opening slot, and the locking component is disposed through the opening slot and adapted to be latched to an inner periphery of the opening slot;
  a positioning component, disposed on the cover and interfered with the chassis to position the cover on the chassis, wherein the positioning component is slidingly disposed on the cover, the positioning component has at least one positioning protruding block, the chassis has at least one positioning hole, and the positioning protruding block is adapted to insert into the positioning hole so that the cover is positioned on the chassis;

a linking shaft, disposed between the locking component and the positioning component and stopping the positioning component from being separated from the chassis, wherein when the position of the locking component is adjusted to release the interference between the locking component and the chassis, the linking shaft is driven by the locking component to release the positioning component, wherein the linking shaft is slidingly disposed on the cover and adapted to be driven by the locking component to slide;

a lock head, wherein the locking component is connected to the lock head, and the lock head is adapted to drive the locking component to adjust the position to release the interference between the locking component and the chassis;

at least one second elastic element, the second elastic element is disposed between the linking shaft and the positioning component, the positioning component is adapted to be interfered with the chassis through an elastic force of the second elastic element, and when the linking shaft releases the positioning component, the positioning component is adapted to resist the elastic force of the second elastic component to be separated from the chassis;

a handle, the cover has an opening, and the handle is connected to the positioning component and extends to an outer surface of the cover through the opening; and a holder, wherein the holder is fixed on the chassis and has a sliding slot, and the positioning component has a pillar and is slidingly disposed on the sliding slot through the pillar.

13. The security structure as claimed in claim 12, wherein the locking component has a latching recess and is adapted to be latched to the chassis through the latching recess.

14. The security structure as claimed in claim 12, wherein the locking component has a first protruding portion, the linking shaft has a second protruding portion, when the locking component is interfered with the chassis, the first protruding portion pushes against the second protruding portion so as to stop the linking shaft from releasing the positioning component, and when the position of the locking component is adjusted to release the interference between the locking component and the chassis, the first protruding portion and the second protruding portion are staggered so that the linking shaft is adapted to release the positioning component.

15. The security structure as claimed in claim 12, wherein the security structure comprises a first elastic element, the first elastic element is connected between the linking shaft and the cover, when the locking component is interfered with the chassis, the locking component resists an elastic force of the first elastic element and pushes against the linking shaft so as to stop the linking shaft from releasing the positioning component, and when the position of the locking component is adjusted to release the interference between the locking component and the chassis, the locking component does not push against the linking shaft and the linking shaft slides via the elastic force of the first elastic element and releases the positioning component.

16. The security structure as claimed in claim 15, further comprising a connecting element, wherein the connecting element is fixed on the cover, and the cover is connected to the first elastic element through the connecting element.

17. The security structure as claimed in claim 16, wherein the connecting element has two protruding ribs, and the linking shaft is slidingly disposed between the two protruding ribs.

18. The security structure according to claim 12, wherein the positioning component is slidingly disposed on the cover along a first direction, the linking shaft is slidingly disposed on the cover along a second direction, and the first direction is perpendicular to the second direction.

19. The security structure as claimed in claim 12, wherein the positioning component has at least one protruding post, the linking shaft has at least one space-allowing hole, the linking shaft is adapted to block the protruding post so as to stop the positioning component from being separated from the chassis, and the at least one space-allowing hole is adapted to be aligned with the protruding post with the linking shaft actuating so as to release the positioning component.

20. The security structure as claimed in claim 19, wherein a diameter of the space-allowing hole is larger than an outer diameter of the protruding post.

21. The security structure as claimed in claim 19, wherein the diameter of the space-allowing hole is equal to a, the outer diameter of the protruding post is equal to b, when the locking component is interfered with the chassis, a distance between a central axis of the protruding post and a central axis of the space-allowing hole is equal to L, when the locking component drives the linking shaft, an actuated stroke of the linking shaft is equal to S, wherein $L-(a-b)/2 \leq S \leq L+(a-b)/2$.

22. The security structure as claimed in claim 19, wherein a hydraulic diameter of the space-allowing hole is larger than an outer diameter of the protruding post.

* * * * *